(12) United States Patent
Terasaki et al.

(10) Patent No.: US 9,735,085 B2
(45) Date of Patent: Aug. 15, 2017

(54) BONDED BODY, POWER MODULE SUBSTRATE, POWER MODULE AND METHOD FOR PRODUCING BONDED BODY

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/119,547

(22) PCT Filed: Jan. 30, 2015

(86) PCT No.: PCT/JP2015/052660
§ 371 (c)(1),
(2) Date: Aug. 17, 2016

(87) PCT Pub. No.: WO2015/141295
PCT Pub. Date: Sep. 24, 2015

(65) Prior Publication Data
US 2017/0062305 A1    Mar. 2, 2017

(30) Foreign Application Priority Data
Mar. 20, 2014 (JP) .................. 2014-058869

(51) Int. Cl.
*H05K 7/00* (2006.01)
*H01L 23/373* (2006.01)
(Continued)

(52) U.S. Cl.
CPC ........ *H01L 23/3735* (2013.01); *B23K 1/0016* (2013.01); *B23K 35/302* (2013.01);
(Continued)

(58) Field of Classification Search
USPC ......................... 361/760, 748, 807
See application file for complete search history.

(56) References Cited

U.S. PATENT DOCUMENTS 8,804,339 B2 * 8/2014 Robert .................. H01L 23/053
174/252
2013/0157835 A1 * 6/2013 Sekine .................. C04B 35/563
501/87

FOREIGN PATENT DOCUMENTS

CN 1167742 A 12/1997
CN 1502463 A 6/2004
(Continued)

OTHER PUBLICATIONS

International Search Report mailed Apr. 14, 2015, issued for PCT/JP2015/052660 and English translation thereof.
(Continued)

*Primary Examiner* — Andargie M Aychillhum
(74) *Attorney, Agent, or Firm* — Locke Lord LLP (57) ABSTRACT

There is provided a bonded body of the invention in which a ceramic member formed of a ceramic containing Al and a Cu member formed of Cu or a Cu alloy are bonded to each other, in which a bonding portion is formed between the ceramic member and the Cu member, an active metal compound region formed of a compound containing active metal is formed on the bonded portion on the ceramic member side, and an Al concentration of the bonding portion having a thickness range of 0.5 μm to 3 μm from one surface of the active metal compound region on the Cu member side towards the Cu member side is in a range of 0.5 at % to 15 at %.

18 Claims, 5 Drawing Sheets

(51) Int. Cl.
  *H01L 25/07* (2006.01)
  *H01L 25/18* (2006.01)
  *C04B 37/02* (2006.01)
  *H01L 23/15* (2006.01)
  *B23K 1/00* (2006.01)
  *B23K 35/30* (2006.01)
  *H05K 1/18* (2006.01)

(52) U.S. Cl.
  CPC ............ *C04B 37/026* (2013.01); *H01L 23/15* (2013.01); *H01L 25/07* (2013.01); *H01L 25/18* (2013.01); *H05K 1/181* (2013.01); *C04B 2235/656* (2013.01); *C04B 2235/6567* (2013.01); *C04B 2237/121* (2013.01); *C04B 2237/122* (2013.01); *C04B 2237/124* (2013.01); *C04B 2237/126* (2013.01); *C04B 2237/127* (2013.01); *C04B 2237/128* (2013.01); *C04B 2237/343* (2013.01); *C04B 2237/366* (2013.01); *C04B 2237/402* (2013.01); *C04B 2237/407* (2013.01); *C04B 2237/60* (2013.01); *C04B 2237/708* (2013.01); *C04B 2237/72* (2013.01); *H01L 2224/32225* (2013.01); *H01L 2224/83101* (2013.01); *H05K 2201/10378* (2013.01)

(56) References Cited

FOREIGN PATENT DOCUMENTS

| CN | 102810487 A | 12/2012 |
|----|-------------|---------|
| JP | 61-215272 A | 9/1986 |
| JP | 04-092871 A | 3/1992 |
| JP | 04-162756 A | 6/1992 |
| JP | 06-183851 A | 7/1994 |
| JP | 10-286666 A | 10/1998 |

OTHER PUBLICATIONS

Zhang, Ling-y an et al, "Active Brazing of AlN Ceramic with Kovar Alloy," Vacuum Electronics, No. 4, 2009, pp. 4-7.(cited in the Apr. 28, 2017 CN OA).

Li, Zi-xi et al., "A Study on the Active Welding in Vacuum of AlN with Ag—Cu—Ti Active Filler Metal," Vacuum Electronics, No. 4, 2007, pp. 59-62.(cited in the Apr. 28, 2017 CN OA).

Liu, Xin et al, "Active Brazing of AlN and Oxygen-Free Copper," Vacuum Electronics, No. 4, 2007, pp. 56-58. (cited in the Apr. 28, 2017 CN OA).

Office Action dated Apr. 28, 2017, issued for the Chinese patent application No. 201580003060.1 and English translation thereof.

* cited by examiner

BONDED BODY, POWER MODULE SUBSTRATE, POWER MODULE AND METHOD FOR PRODUCING BONDED BODY

TECHNICAL FIELD

The present invention relates to a bonded body obtained by strongly bonding a ceramic member and a Cu member to each other, a power module substrate including this bonded body, a power module, and a method for producing a bonded body.

Priority is claimed on Japanese Patent Application No. 2014-058869, filed Mar. 20, 2014, the amount of which is incorporated herein by reference.

BACKGROUND ART

A semiconductor device such as an LED or a power module has a structure in which a semiconductor element is bonded onto a circuit layer formed of a conductive material.

A power semiconductor element used for controlling the high power of wind power generation or electrical vehicles such as electric cars has a significant heating value. Accordingly, a ceramic substrate having excellent heat resistance and insulating properties, such as $Si_3N_4$ (silicon nitride), AlN (aluminum nitride), or $Al_2O_3$ (alumina) has been used as a substrate for mounting such a power semiconductor element. A power module substrate obtained by bonding a Cu plate having excellent electric conductivity to one surface of this ceramic substrate as a circuit layer has been widely used in the related art. A metal plate may be bonded to the other surface of a ceramic substrate.

In the related art, a so-called direct bonding copper (DBC) method of performing heating at a temperature equal to or higher than 1000° C. in the $N_2$ atmosphere while applying loads to a ceramic substrate and a Cu plate in a state where the Cu plate is laminated on the ceramic substrate is known as a method of bonding a Cu plate to a ceramic substrate (for example, see PTL 1).

CITATION LIST

Patent Literature

[PTL 1] Japanese Unexamined Patent Application, First Publication No. H04-162756

DISCLOSURE OF INVENTION

Technical Problem

However, in a case where a ceramic substrate and a Cu plate are bonded to each other by the DBC method disclosed in PTL 1, the ceramic substrate and the Cu plate are bonded to each other by heating at a temperature equal to or higher than 1000° C., and thus, thermal loads are applied to the ceramic substrate and bond reliability of the ceramic substrate and the Cu plate may be decreased.

The invention is made in consideration of the aforementioned circumstances and an object thereof is to provide a bonded body having high bond reliability of a ceramic member and a Cu member, a power module substrate, a power module, and a method for producing a bonded body.

Solution to Problem

In order to solve the aforementioned problems, some aspects of the invention provide a bonded body, a power module substrate, a power module, and a manufacturing method for producing a bonded body.

A first aspect of the invention includes a bonded body in which a ceramic member formed of a ceramic containing Al and a Cu member formed of Cu or a Cu alloy are bonded to each other, in which a bonding portion is formed between the ceramic member and the Cu member, an active metal compound region formed of a compound containing active metal is formed on the bonded portion on the ceramic member side, and an Al concentration of the bonding portion having a thickness in a range of 0.5 µm to 3 µm from one surface of the active metal compound region on the Cu member side towards the Cu member side is in a range of 0.5 at % to 15 at %.

Al components of the bonding portion are generated by decomposition of some constituent materials of the ceramic member, that is, ceramic components containing Al at the time of bonding of the ceramic member and the Cu member and diffusing of Al components towards the bonding portion. The Al concentration indicates the degree of decomposition of the ceramic member and shows that, as the Al concentration increases, decomposition of the ceramic member proceeds and a bonding force between the ceramic member and the bonding portion increases.

Herein, when the Al concentration is less than 0.5 at %, decomposition of the ceramic member does not proceed and the peeling rate between the ceramic member and the Cu member increases. When the Al concentration exceeds 15 at %, the amount of Al components of the bonding portion increases and the amount of Al intermetallic compounds increases. Accordingly, the hardness of the bonding portion increases and the bond reliability between the ceramic member and the Cu member decreases.

Thus, as described in the invention, it is possible to retain a high bonding force between a ceramic member and a bonding portion and realize a bonded body in which a ceramic member and a Cu member are strongly bonded to each other by decreasing the peeling rate of a bonding portion, by setting the Al concentration of a bonding portion to be in a predetermined range.

In the bonded body of the invention, the one surface of the active metal compound region is a surface having ruggedness and the thickness range is a range from a point of the ruggedness nearest to the Cu member.

Accordingly, it is possible to more accurately figure out a degree of decomposition of a ceramic member by using an Al concentration and to reliably realize a decrease in the peeling rate of a bonding portion.

In the bonded body of the invention, the ceramic member is configured of any of AlN and $Al_2O_3$.

It is possible to produce a bonded body having excellent insulating properties and heat resistance by selecting AlN and $Al_2O_3$ as a ceramic member.

In the bonded body of the invention, the active metal compound region contains any of nitrides of an active metal and oxides of an active metal.

It is possible to improve bondability between a ceramic member and a Cu member and to reliably realize a decrease in the peeling rate between a ceramic member and a Cu member, by containing nitrides of an active metal and oxides of an active metal in an active metal compound region.

According to a second aspect of the invention, a power module substrate includes a bonded body, in which a metal layer is formed on a surface of the ceramic member opposite to a surface to which a circuit layer is bonded, by using the Cu member as the circuit layer.

In the power module substrate, a metal layer is formed on a surface of a ceramic member opposite to a surface to which a circuit layer is bonded, by using a Cu member as this circuit layer. Accordingly, it is possible to retain the Al concentration of a bonding portion formed between a ceramic member and a circuit layer to be in a predetermined range to retain a high bonding force between a ceramic member and a bonding portion, and to realize a power module substrate in which a ceramic member and a circuit layer are strongly bonded to each other by decreasing the peeling rate of a bonding portion.

In the power module substrate of the invention, the metal layer is formed of Cu or a Cu alloy.

In this case, since the metal layer formed of Cu or a Cu alloy is formed on a surface of the ceramic member opposite to a surface to which a circuit layer is bonded, it is possible to realize a power module substrate having excellent heat radiation.

In the power module substrate of the invention, the metal layer is formed of Al or an Al alloy.

In this case, deformation resistance is decreased by bonding a metal layer formed of Al or an Al alloy to a surface of a ceramic member opposite to a surface to which a circuit layer is bonded. Accordingly, when heat stress is applied to the ceramic member, the heat stress can be absorbed by the metal layer formed of Al or an Al alloy and it is possible to prevent fracture of the ceramic member due to heat stress.

According to a third aspect of the invention, there is provided a power module including: the power module substrate; and an electric component bonded to a surface of the circuit layer on a side opposite to the ceramic member.

According to the power module of the invention, since the power module substrate including the bonded body described above is used, the ceramic member and the circuit layer are strongly bonded to each other and excellent reliability is obtained.

According to a fourth aspect of the invention, a method for producing a bonded body in which a ceramic member formed of a ceramic containing Al and a Cu member formed of Cu or a Cu alloy are bonded to each other includes: a laminating step of forming a laminate obtained by laminating the Cu member on the ceramic member through a Cu—P-based brazing material and an active metal material containing an active metal; and a heating treatment step of melting the Cu—P-based brazing material by performing heating treatment with respect to the laminate and diffusing Al contained in the ceramic member towards the Cu—P-based brazing material.

According to the method for producing a bonded body of the invention, it is possible to retain a high bonding force between a ceramic member and a bonding portion and to produce a bonded body in which a ceramic member and a Cu member are strongly bonded to each other by decreasing the peeling rate of a bonding portion, by diffusing Al contained in the ceramic member towards a Cu—P-based brazing material in the heating treatment step.

In the method for producing a bonded body of the invention, the Cu—P-based brazing material contains 3 mass % to 10 mass % of P.

Since the Cu—P-based brazing material containing 3 mass % to 10 mass % of P has a low melting point, a melt is easily generated when the Cu—P-based brazing material is heated, and a reaction between the ceramic member and the Cu member easily proceeds. Accordingly, it is possible to strongly bond the ceramic member and the Cu member to each other.

In the method for producing a bonded body of the invention, the Cu—P-based brazing material is any one kind selected from a Cu—P brazing material, a Cu—P—Sn brazing material, a Cu—P—Sn—Ni brazing material, and a Cu—P—Zn brazing material.

In a case where such brazing materials are used, it is possible to reliably bond a ceramic member and a Cu member to each other, because the melting point of the brazing materials is low.

Advantageous Effects of Invention

According to the invention, it is possible to provide a bonded body having high bond reliability between a ceramic member and a Cu member, a power module substrate, a power module, and a method for producing a bonded body.

BEST MODE FOR CARRYING OUT THE INVENTION

Hereinafter, a bonded body and a method for producing the same according to an embodiment of the invention will be described with reference to the drawings. Each embodiment below specifically describes a gist of the invention for easier understanding is not for limiting the invention, unless otherwise noted. For convenience, the drawings used in the following description may be shown by enlarging portions of main parts in order to easily describe characteristics of the invention and dimensional ratios of each constituent element may not be the same as actual ratios.

(Bonded Body)

Figure 1:
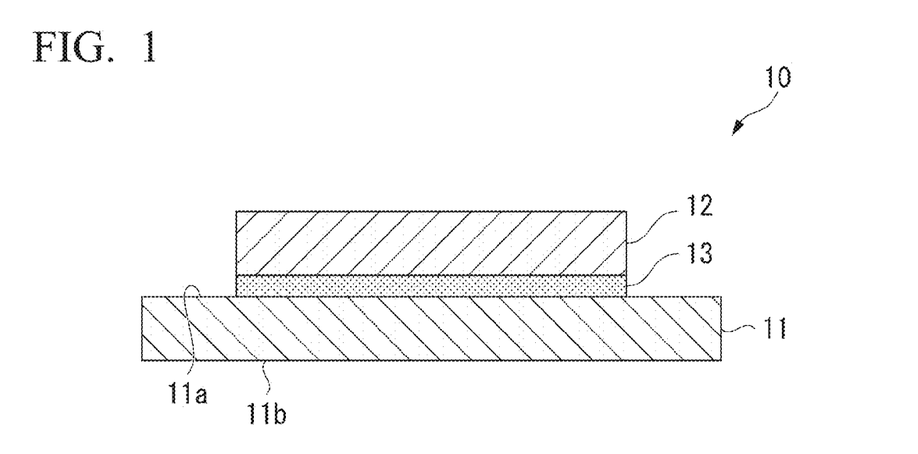
FIG. 1 is a sectional view showing an example of a bonded body according to an embodiment of the invention.

FIG. 1 is a sectional view showing an example of a bonded body according to an embodiment of the invention.

A bonded body 10 is used as a power module substrate configuring a power module including a power semiconductor, for example. As shown in FIG. 1, this bonded body 10 includes a ceramic substrate (a ceramic member) 11 and a Cu member 12 which is disposed on one surface 11a (upper surface in FIG. 1) of the ceramic substrate 11. The ceramic substrate 11 and the Cu member 12 are bonded to each other with a bonding portion 13 interposed therebetween. The bonding portion 13 is formed by performing heating treatment with respect to an active metal material and a Cu—P-based material, for example. A method of producing the bonded body 10 will be described later.

The ceramic substrate 11 is configured with ceramic having high insulating properties containing Al, for example, AlN (aluminum nitride) or $Al_2O_3$ (alumina). In the embodiment, the ceramic substrate 11 is configured with AlN having excellent heat radiation. The thickness of the ceramic substrate 11 is, for example, set in a range of 0.2 mm to 1.5 mm and a ceramic substrate having a thickness of 0.635 mm is used in the embodiment.

As the Cu member 12, a metal plate formed of Cu or a Cu alloy having high an electric conductivity is used. In the embodiment, a metal plate formed of oxygen-free copper is used as the Cu member 12. The thickness of the Cu member 12 is, for example, set in a range of 0.1 mm to 1.0 mm and a Cu member having a thickness of 0.6 mm is used in the embodiment.

The Cu member 12 described above is, for example, used as a circuit layer of a power module substrate.

Figure 2:
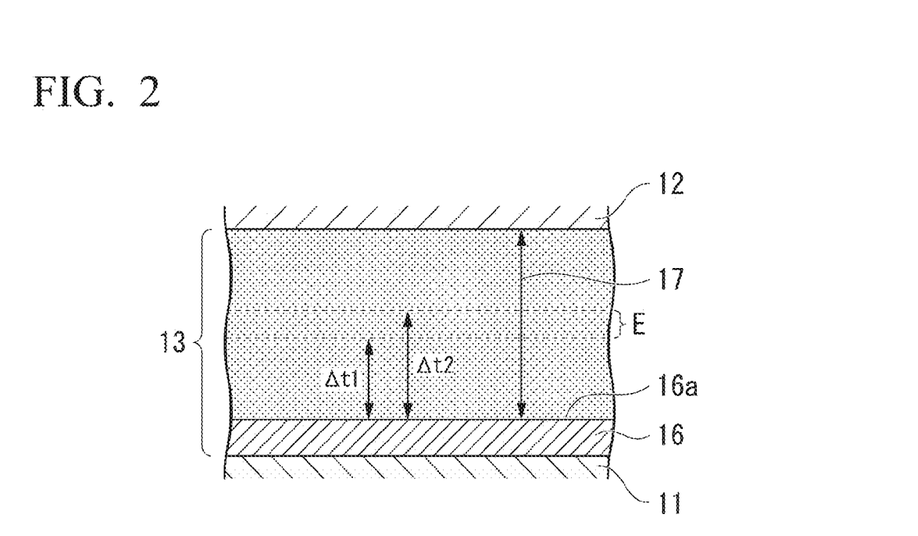
FIG. 2 is an enlarged sectional view of main parts showing a bonding portion of a bonded body according to the embodiment of the invention.
Figure 3:
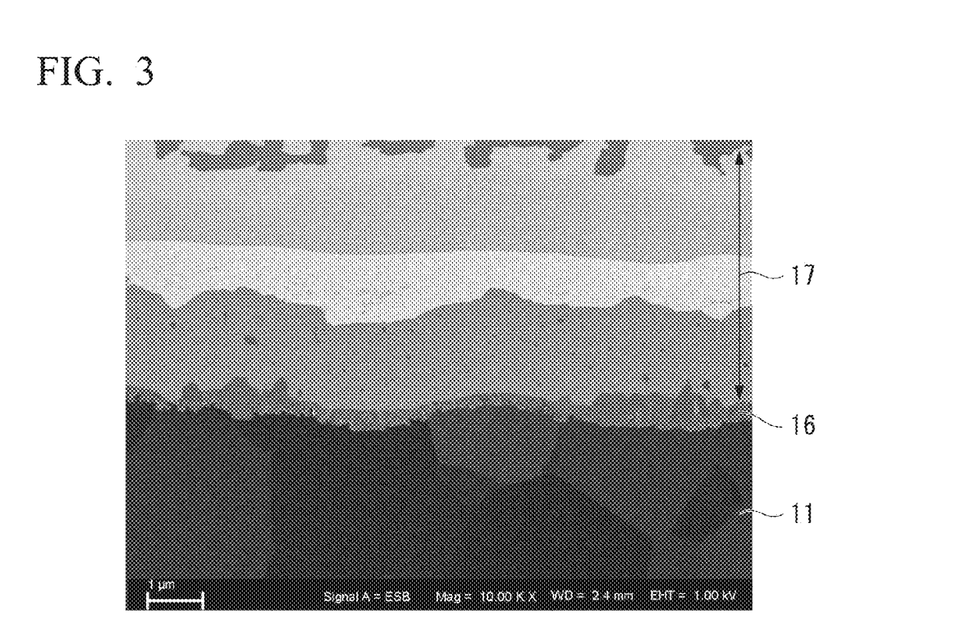
FIG. 3 is an observation image of a cross section of the bonding portion of the bonded body according to the embodiment of the invention.

FIG. 2 is an enlarged sectional view of main parts showing an outline of the bonding portion 13 of the bonded body according to the embodiment of the invention. FIG. 3 is an observation image of a cross section of the bonding portion 13 of the bonded body according to the embodiment of the invention. An example showing a case where a Cu—P—Sn—Ni brazing material and Ti as an active metal are used for bonding the ceramic substrate 11 and the Cu member 12 to each other is used as a configuration of the bonding portion 13 of the embodiment shown in FIG. 2 and FIG. 3. Zr, Nb, Hf, and the like can be used, for example, as an active metal, in addition to Ti.

The bonding portion 13 is a bonding layer which is generated by performing thermal treatment with respect to an active metal material (Ti in the embodiment) and a Cu—P-based brazing material at a predetermined temperature for a predetermined period of time.

The bonding portion 13 includes an alloy layer 17 which is on the Cu member 12 side and an active metal compound region 16 which is on the ceramic substrate 11 side.

In the embodiment, the active metal compound region 16 is configured with Ti nitrides formed by combining Ti diffused from an active metal material and N contained in AlN configuring the ceramic substrate 11 with each other, for example, TiN, as a main element. The alloy layer 17 is configured with Cu, P, Sn, and Ni which are components of a brazing material, Ti diffused from an active metal material, and an alloy or an intermetallic compound thereof.

The bonding portion 13 having such a configuration is formed so that an Al concentration in a thickness range E of 0.5 µm to 3 µm from one surface 16a of the active metal compound region 16 on the Cu member 12 side towards the Cu member 12 side is in a range of 0.5 at % to 15 at %. That is, in a region extending to a portion having a thickness range E of 2.5 µm between a surface extending to a position in a thickness range of 0.5 µm ($\Delta t1$) from the one surface 16a of the active metal compound region 16 towards the Cu member 12, and a surface extending to a position in a thickness range of 3 µm ($\Delta t2$) towards the Cu member 12, the Al concentration is from 0.5 at % to 15 at %. The Al concentration is an average value in the thickness range E. The Al concentration in the thickness range E is preferably from 0.5 at % to 10 at % but there is no limitation thereof.

Al components of the bonding portion 13 are generated by decomposition of some constituent materials of the ceramic substrate 11, that is, ceramic components containing Al at the time of bonding of the ceramic substrate 11 and the Cu member 12 and diffusing of Al components towards the bonding portion 13. In the embodiment, AlN configuring the ceramic substrate 11 is decomposed and Al is diffused towards the bonding portion 13.

The Al concentration of the bonding portion 13 in the thickness range E is controlled to a desired value by setting a bonding temperature or setting a heating period of time in a heating treatment step, at the time of bonding the ceramic substrate 11 and the Cu member 12 to each other.

In the embodiment, the active metal compound region 16 is configured with nitrides of an active metal formed by combining an active metal material and N contained in AlN configuring the ceramic substrate 11 with each other as a main element, but in a case where $Al_2O_3$ is used as the ceramic substrate 11, the active metal compound region 16 is configured with oxides of an active metal formed by combining O contained in $Al_2O_3$ and an active metal with each other, as a main element.

Figure 4:
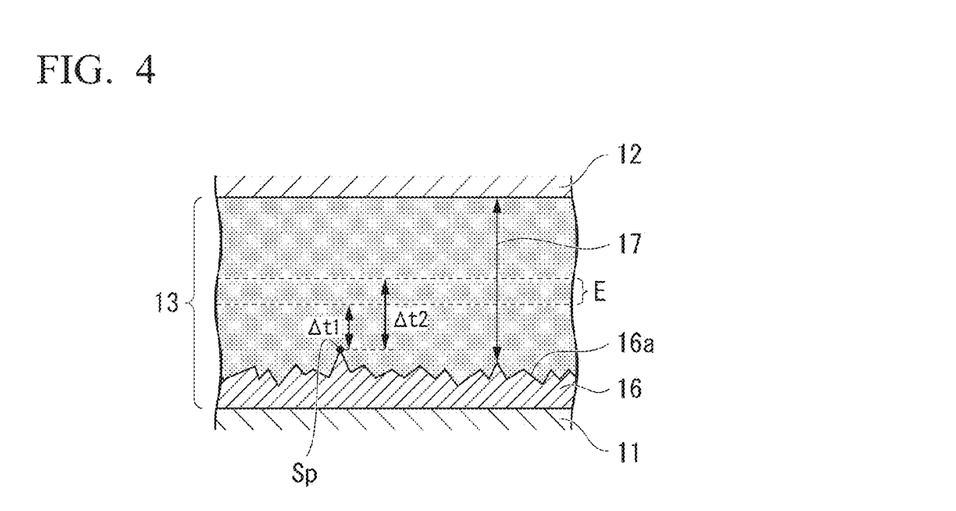
FIG. 4 is an enlarged sectional view of main parts showing another example of the bonding portion of the bonded body according to the embodiment of the invention.

In FIG. 2, the one surface 16a of the active metal compound region 16 is schematically a flat surface, but in practice, as shown in the observation image of FIG. 3, the one surface 16a of the active metal compound region 16 is a surface having a plurality of portions having ruggedness. In this case, as shown in FIG. 4, for example, the thickness range E of 0.5 µm to 3 µm may be set using a point Sp closest to the Cu member (apex Sp which is most protruded to the Cu member 12 side) as a base point, from the one surface 16a of the active metal compound region 16, for the thickness range E of the bonding portion 13 in which the Al concentration is regulated.

It is also preferable that a metal member, for example, an Al member formed of Al or an Al alloy and a Cu member formed of Cu or a Cu alloy are further bonded to the other surface 11b side of the ceramic substrate 11. As an example of a metal member described above, an Al member formed of 4N—Al or a Cu member formed of oxygen-free copper is used. An Al—Si-based brazing material or a Cu—P-based brazing material can be used, for example, in the bonding of the ceramic member 11 and the metal member to each other. As a Al—Si-based brazing material, a brazing material having a Si content of 1 mass % to 12 mass % is used.

According to the bonded body 10 having the configuration described above, the bonding portion 13 for bonding the ceramic substrate 11 and the Cu member 12 to each other is formed so that the Al concentration in the thickness range E of 0.5 µm to 3 µm from the one surface 16a of the active metal compound region 16 towards the Cu member 12 side is from 0.5 at % to 15 at %. AlN or $Al_2O_3$ configuring the ceramic substrate 11 is decomposed and Al is diffused towards the bonding portion 13. Accordingly, the Al concentration indicates the degree of decomposition of AlN or $Al_2O_3$ and shows that, as the Al concentration increases, decomposition of AlN or $Al_2O_3$ proceeds and a bonding force between the ceramic substrate 11 and the bonding portion 13 increases.

Therefore, it is possible to retain a high bonding force between the ceramic substrate 11 and the bonding portion 13 and to decrease the peeling rate of the bonding portion 13 by controlling the Al concentration in a specific region of the bonding portion 13.

(Method for Producing Bonded Body)

A method for producing the bonded body having the configuration described above will be described.

Figure 5:
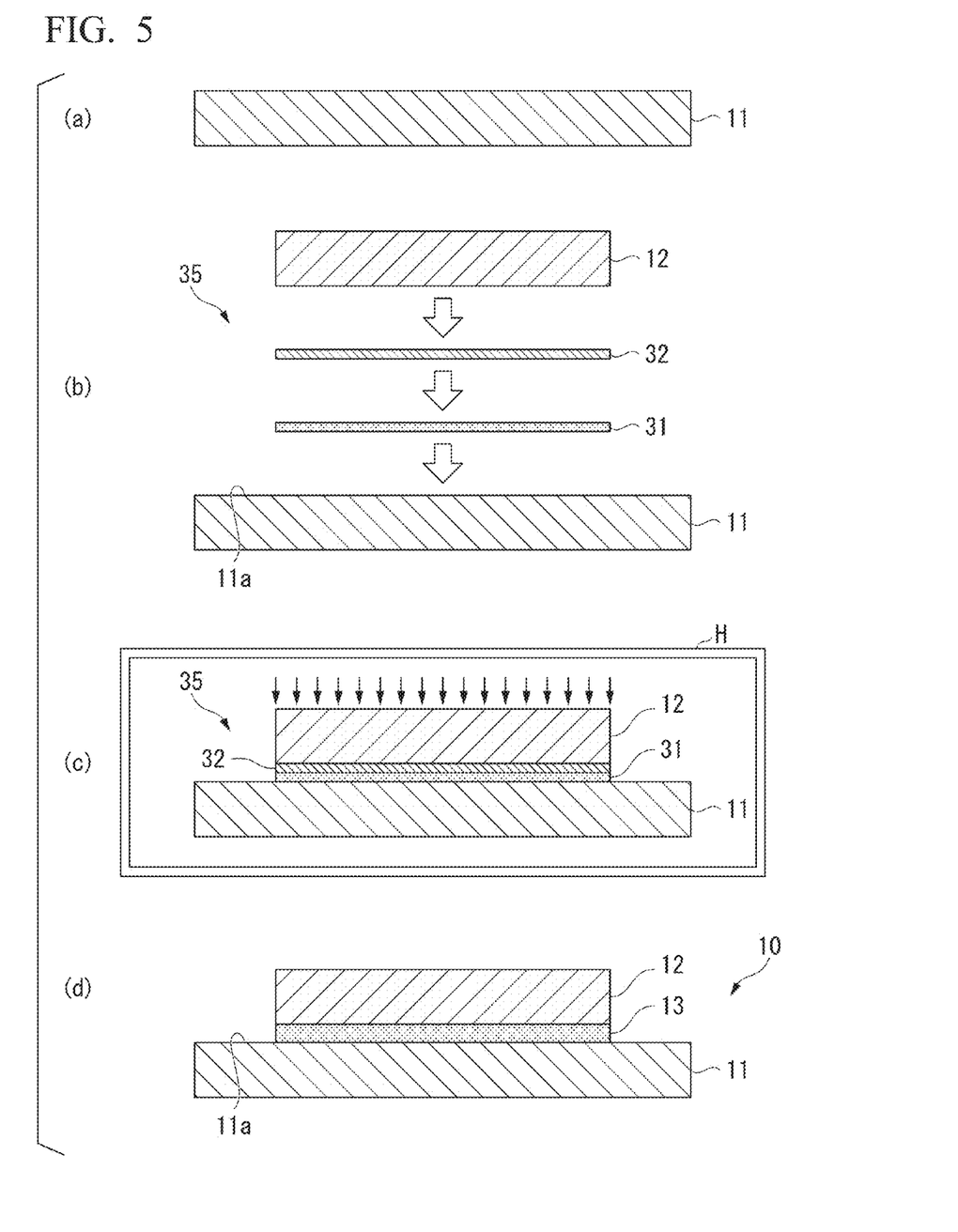
FIG. 5 is a sectional view showing a step-wise method for producing a bonded body according to the embodiment of the invention.

FIG. 5 is a sectional view showing a method for producing a bonded body according to the embodiment of the invention in a step-wise manner.

For example, when producing a bonded body used as a power module substrate, first, the ceramic substrate (ceramic member) 11 formed of ceramic containing Al such as AlN (aluminum nitride) or $Al_2O_3$ (alumina) is prepared (see FIG. 5(a)). In the embodiment, a ceramic substrate formed of AlN and having a thickness of 0.635 mm was used.

Then, a brazing material 31, an active metal material 32, and the Cu member 12 are laminated on the ceramic substrate 11 on the one surface 11a side in order to form a laminate 35 (see FIG. 5(b): laminating step). As the brazing material 31, a Cu—P-based brazing material is used. Examples of a Cu—P-based brazing material include a Cu—P brazing material, a Cu—P—Sn-based brazing material, a Cu—P—Sn—Ni-based brazing material, a Cu—P—Zn-based brazing material, a Cu—P—Sn—Mn-based brazing material, a Cu—P—Sn—Cr-based brazing material, and a Cu—P—Sn—Fe-based brazing material, and in the embodiment a Cu—P—Sn—Ni-based brazing material is used.

The composition of the Cu—P—Sn—Ni brazing material is specifically set as Cu-7 mass % P-15 mass % Sn-10 mass % Ni. Herein, the Cu—P—Sn—Ni brazing material is formed so that the thickness thereof is from 5 μm to 150 μm.

P which is a component of a Cu—P-based brazing material is an element having operation effects of decreasing a melting point of a brazing material. In addition, P is an element having operation effects of preventing oxidation of a brazing material by coating a brazing material surface with P oxides generated by oxidizing P and improving wettability of a brazing material by coating a surface of a melted brazing material with P oxides having excellent fluidity.

When the amount of P is less than 3 mass %, a melting point of a brazing material may increase due to an insufficient effect of decreasing a melting point of a brazing material or bondability between the ceramic substrate 11 and the Cu member 12 may be decreased due to insufficient fluidity of a brazing material. When the amount of P exceeds 10 mass %, a large amount of brittle intermetallic compounds are formed and bondability or bond reliability between the ceramic substrate 11 and the Cu member 12 may be decreased.

Due to such a reason, the amount of P contained in a Cu—P-based brazing material is preferably in a range of 3 mass % to 10 mass %. The amount of P contained in the Cu—P-based brazing material is more preferably in a range of 6 mass % to 8 mass %, but there is no limitation thereof.

Sn which is an example of components of the Cu—P-based brazing material is an element having operation effects of decreasing a melting point of a brazing material. When the amount of Sn is equal to or greater than 0.5 mass %, it is possible to reliably decrease a melting point of a brazing material. When the amount of Sn is equal to or smaller than 25 mass %, it is possible to prevent low-temperature embrittlement of a brazing material and improve bond reliability between the ceramic substrate 11 and the Cu member 12.

Due to such a reason, in a case of containing Sn in the Cu—P-based brazing material, the amount thereof is preferably in a range of 0.5 mass % to 25 mass %.

Ni, Cr, Fe, or Mn which are examples of components of the Cu—P-based brazing material are elements having operation effects of preventing formation of intermetallic compounds containing P in interfaces between the ceramic substrate 11 and the brazing material.

When the total of the amount of any one kind or two or more kinds of Ni, Cr, Fe, and Mn is equal to or greater than 2 mass %, it is possible to prevent formation of intermetallic compounds containing P in bonding interfaces between the ceramic substrate 11 and the brazing material and improve bond reliability between the ceramic substrate 11 and the Cu member 12.

When the total of the amount of any one kind or two or more kinds of Ni, Cr, Fe, and Mn is equal to or smaller than 20 mass %, it is possible to prevent an increase in a melting point of a brazing material, prevent a decrease in fluidity of a brazing material, and improve bondability between the ceramic substrate 11 and the Cu member 12.

Due to such a reason, in a case of containing any one, or two or more of Ni, Cr, Fe, and Mn in the Cu—P-based brazing material, the total amount thereof is preferably in a range of 2 mass % to 20 mass %.

Zn which is an example of components of a Cu—P-based brazing material is an element having operation effects of improving oxidation resistance of a brazing material.

When the amount of Zn is equal to or greater than 0.5 mass %, it is possible to sufficiently ensure oxidation resistance of a brazing material and improve bondability. When the amount of Zn is equal to or smaller than 50 mass %, it is possible to prevent formation of a large amount of brittle intermetallic compounds and ensure bond reliability between the ceramic substrate 11 and the Cu member 12.

Due to such a reason, in a case of containing Zn in a Cu—P-based brazing material, the amount thereof is preferably in a range of 0.5 mass % to 50 mass %.

The brazing material 31 is formed by applying a material (brazing material paste) obtained by mixing powders of components of constituent elements with each other and setting a resultant material in a paste form using a suitable binder onto the one surface 11a of the ceramic substrate 11.

The active metal material 32 contains at least an active element. As characteristics of the active metal material 32, a foil, powder, or paste kneaded by adding a suitable binder to powder is used.

In the embodiment, a Ti foil is used as an active metal material and a thickness of the Ti foil is set to be from 0.5 μm to 25 μm. The configuration of the Ti foil may be set to have purity equal to or greater than 99.4 mass % and is set to have purity of 99.6 mass % in the embodiment.

In the embodiment, the active metal material 32 is arranged on a side of the Cu member 12, but can be arranged on a side of the ceramic member 11. In this case, the laminating order of the laminate 35 is the order of the ceramic member 11, the active metal material 32, the brazing material 31, and the Cu member 12.

Next, as shown in FIG. 5(c), the laminate 35 is put into a vacuum heating treatment furnace H and is heated to a temperature equal to or higher than a melting temperature (bonding temperature) of the brazing material 31 while pressurizing the laminate 35 (heating treatment step). By doing so, the brazing material 31 is melted. After that, as shown in FIG. 5(d), when the brazing material 31 is cooled, the bonded body 10 in which the ceramic member 11 and the Cu member 12 are bonded to each other with the bonding portion 13 interposed therebetween is obtained.

In the embodiment, as heating treatment conditions of the heating treatment step, a pressurizing force applied to a laminating direction of the laminate 35 was set to be from 1 kgf/cm$^2$ to 35 kgf/cm$^2$ (0.10 MPa to 3.43 MPa), the pressure in a vacuum heating furnace was set to be from $10^{-6}$ Pa to $10^{-3}$ Pa, a heating temperature was set to be from 700° C. to 850° C., and a heating period of time was set to be from 10 minutes to 60 minutes, respectively.

In the heating treatment step, heating treatment is performed to extent in which AlN of the one surface 11a of the ceramic substrate 11 is decomposed and Al is diffused in the bonding portion 13. That is, the heating treatment is performed so that, in the bonding portion 13 of the obtained bonded body 10 shown in FIG. 2, Al concentration in the thickness range E of 0.5 μm to 3 μm from the one surface 16a of the active metal compound region 16 on the Cu member 12 side towards the Cu member 12 side is from 0.5 at % to 15 at %.

Accordingly, a degree of decomposition of AlN configuring the ceramic substrate 11 is in a suitable range and a bonding force between the ceramic substrate 11 and the bonding portion 13 is increased. Therefore, it is possible to retain a high bonding force between the ceramic substrate 11 and the bonding portion 13 of the bonded body 10 and decrease the initial peeling rate of the bonding portion 13.

(Power Module Substrate and Power Module)

Configurations of a power module substrate and a power module according to the embodiment of the invention using the bonded body described above will be described. The same reference numerals are used for the same constituent elements as those of the bonded body 10 shown in FIG. 1 and FIG. 2 and the specific description will be omitted.

Figure 6:
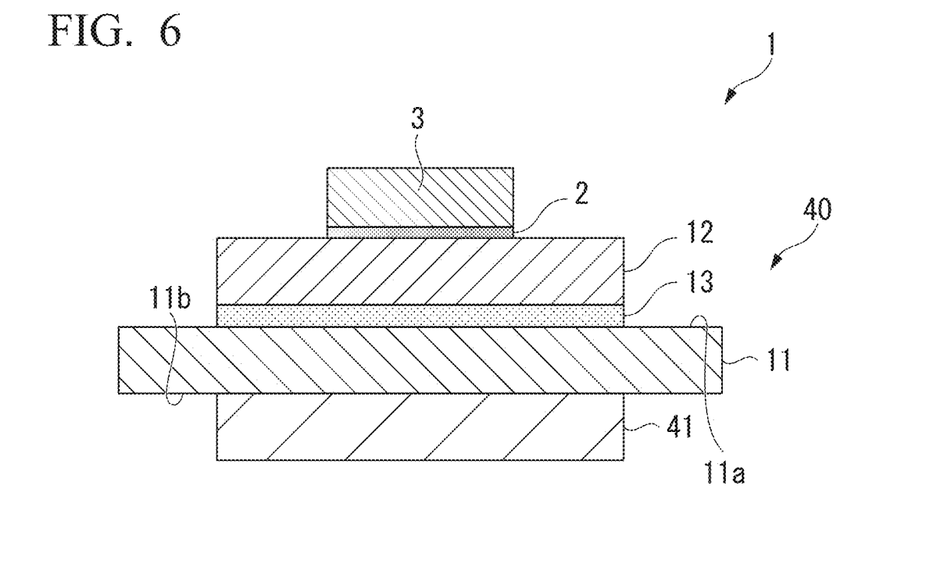
FIG. 6 is a sectional view showing a power module substrate and a power module according to the embodiment of the invention.

FIG. 6 is a sectional view showing the power module substrate and the power module according to the embodiment of the invention.

A power module 1 includes a power module substrate 40, and a power semiconductor (electronic component) 3 which is bonded to a surface of one side (upper side in FIG. 6) of the power module substrate 40 with a solder layer 2 interposed therebetween.

Here, the solder layer 2 is a Sn—Ag-based, a Sn—In-based, or a Sn—Ag—Cu-based solder material, for example.

The power module substrate 40 includes the bonded body 10 including the ceramic substrate (ceramic member) 11, the Cu member (circuit layer) 12 which is disposed on one surface 11a (upper surface in FIG. 6) of the ceramic substrate 11, and the bonding portion 13 for bonding the ceramic substrate 11 and the Cu member 12 to each other.

The power module substrate 40 further includes a metal layer 41 on the other surface 11b (lower surface in FIG. 6) of the ceramic substrate 11 forming a surface opposite to the one surface 11a of the ceramic substrate 11 where the Cu member (circuit layer) 12 is disposed. As the metal layer 41, a metal plate formed of Cu or a Cu alloy is used, for example. In the embodiment, a metal plate formed of oxygen-free copper is used as the metal layer 41. The thickness of the Cu member 12 is, for example, set in a range of 0.1 mm to 1.0 mm and a Cu member having a thickness of 0.6 mm is used in the embodiment.

When the Cu member (circuit layer) 12 of the power module substrate 40 is applied to a power module, the Cu member configures a circuit layer of a power semiconductor. That is, the Cu member 12 forms a conductor of a power semiconductor. In addition, the ceramic substrate 11 forms an insulator which insulates the lower layer side of the conductor.

According to the power module substrate 40 and the power module 1 described above, it is possible to realize the power module substrate 40 and the power module 1 in which the Al concentration of a specific region of the bonding portion 13 for bonding the ceramic substrate 11 and the Cu member (circuit layer) 12 to each other is controlled and a high bonding force between the ceramic substrate 11 and the bonding portion 13 is retained, by using the bonded body 10 shown in FIG. 1.

In the embodiment, the metal layer 41 is formed on the other surface 11b of the ceramic substrate 11 in the power module substrate 40, but the metal layer 41 may not be formed. The material of the metal layer 41 is not limited to Cu or a Cu alloy and various metals can be used. For example, Al or an Al alloy can be used as a material of the metal layer.

When the metal layer 41 is formed with Al or an Al alloy and heat stress is applied to the ceramic member, the heat stress can be absorbed by the metal layer formed of Al or an Al alloy and it is possible to prevent fracture of the ceramic member due to heat stress. In a case of forming the metal layer with Al or an Al alloy, the thickness of the metal layer is preferably set in a range of 0.1 mm to 3.0 mm.

EXAMPLES

Example 1

A brazing material (37 mm×37 mm) shown in Table 1, an active metal material (37 mm×37 mm) shown in Table 1, and a Cu plate (37 mm×37 mm×thickness of 0.3 mm) formed of oxygen-free copper were laminated in order on one surface of a ceramic substrate (40 mm×40 mm×thickness of 0.635 mm) formed of materials shown in Table 1 to form a laminate. In Example 4, Cu-7 mass % P-15 mass % Sn-10 mass % Ni powder and paste formed of Ti powder were used as a brazing material and an active element. The coating thickness of the paste was set to 80 μm.

The laminate was put into a vacuum heating furnace in a state of being pressurized at pressure of 5 kgf/cm² (0.49 MPa) in a laminating direction and heated to bond the Cu plate to one surface of the ceramic substrate. The heating temperature and time were as shown in Table 1.

By doing so, bonded bodies of Examples 1 to 8 and Comparative Examples 1 to 3 were obtained. The "presence or absence of active metal compound region", "Al concentration of bonding portion", and a "bonding rate" of the obtained bonded bodies were evaluated.

(Presence or Absence of Active Metal Compound Region)

A cross section of the bonded body was observed using an electron probe microanalyzer (EPMA, JXA-8530F manufactured by JEOL Ltd.) with 10000 magnification and element mapping of an element contained in the ceramic substrate (N in a case of AlN and O in a case of $Al_2O_3$) and the active metal element is obtained. In the obtained mapping, in a case where an active metal element and an element contained in the ceramic substrate are present in the same region, an active metal compound region was obtained.

Figure 7:
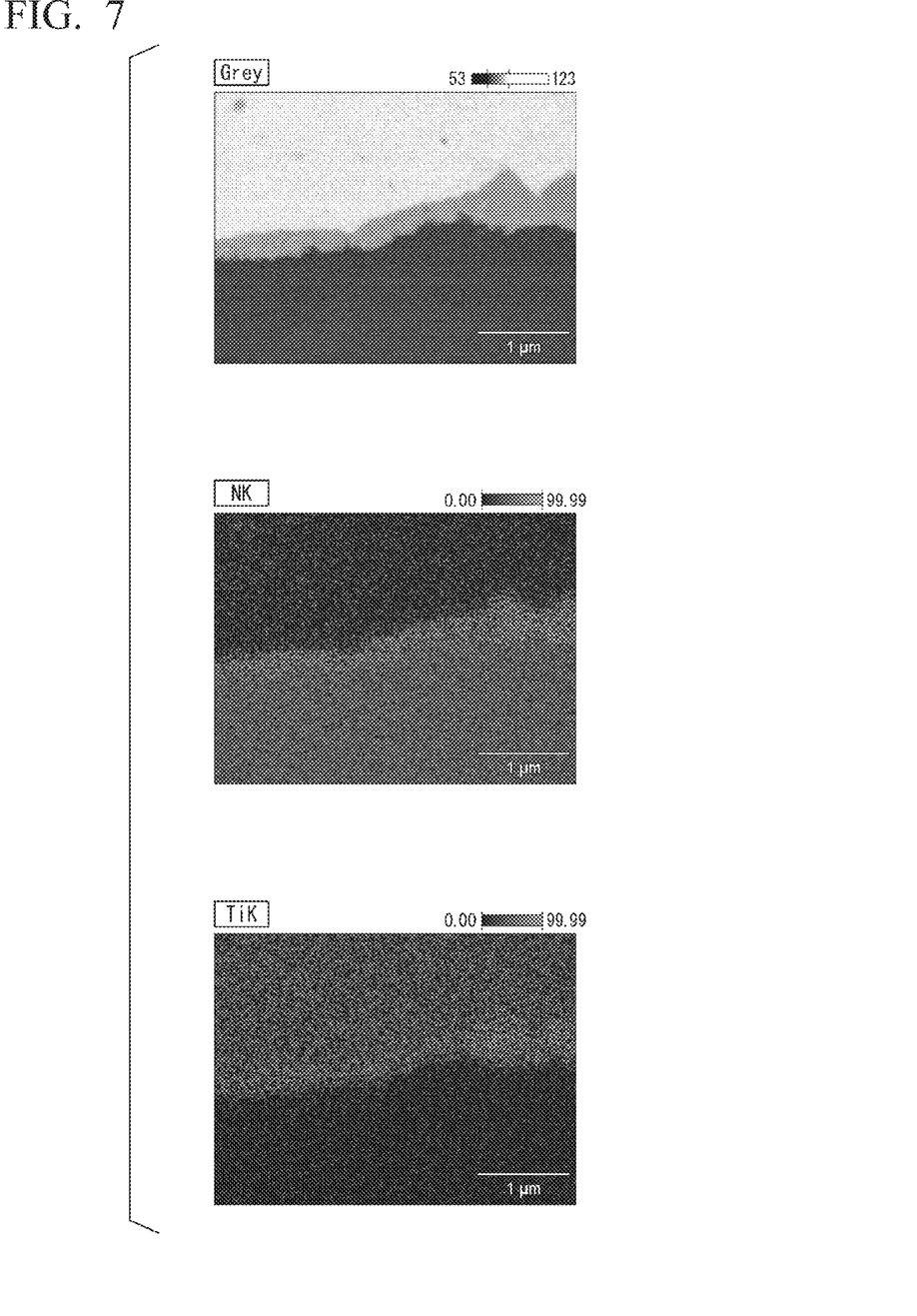
FIG. 7 is a diagram showing an observation example of an active metal compound region of an example.

FIG. 7 shows an observation example of the active metal compound region. In FIG. 7, the active metal element (Ti) and the element (N) contained in the ceramic substrate (AlN) are present in the same region and an active metal compound region was obtained.

(Al Concentration of Bonding Portion)

As a measuring method of the Al concentration of the bonding portion, the cross section of the bonding portion was analyzed using an electron probe microanalyzer (EPMA, JXA-8530F manufactured by JEOL Ltd.) and the Al concentration was measured by performing quantitative analysis of the range of 0.5 μm to 3 μm from one surface of the active metal compound region. Specifically, arbitrary 10 points in the range described above were analyzed and the average value thereof was set as the Al concentration.

(Hot-Cold Cycle Test)

In a hot-cold cycle test, 2000 cycles including a cycle of 5 minutes at −40° C. and a cycle of 5 minutes at 150° C. were executed with respect to the power module substrate with the liquid phase (Fluorinert) using a hot-cold shock testing device (TSB-51 manufactured by ESPEC Corporation).

(Bonding Rate)

In the evaluation of the bonding rate, a bonding rate of interfaces between the ceramic substrate and the Cu member with respect to the bonded body was evaluated using an ultrasonic test device (Fine SAT200 manufactured by Hitachi Power Solutions Co., Ltd.), and the bonding rate was calculated from the following equation.

Herein, an initial bonding area was set as an area to be bonded before bonding, that is, an area (37 cm×37 mm) of the Cu member in this example. Since peeling is shown with white portions in the bonding portion in an image obtained by binarizing an ultrasonic flaw detection image, the area of the white portions were set as the peeling area.

(bonding rate (%))={(initial bonding area)−(peeling area)}/(initial bonding area)×100

The bonding rate was evaluated before performing the hot-cold cycle test (initial bonding rate) and after the hot-cold cycle test.

Results are shown in Table 1.

(OFC) were laminated in order, to one and the other surfaces of a ceramic substrate and a laminate was formed. This laminate was put into a vacuum heating furnace in a state of being pressurized in a laminating direction and a power module substrate in which a Cu plate is bonded to one and the other surfaces of the ceramic substrate by heating the laminate was manufactured. AlN was used as a ceramic substrate in Example 11 and $Al_2O_3$ was used in Example 12.

The bonding rate of a circuit layer (one surface of the ceramic substrate) was evaluated with respect to the power module substrate obtained in Examples 9 to 12. The evaluating method was the same as that in Example 1.

The results are shown in Table 2.

TABLE 2

| | | Bonding rate of circuit layer [%] | |
|---|---|---|---|
| | Metal layer | Initial stage | After hot-cold cycle |
| Example 9 | 4N—Al | 99.1 | 96.8 |
| Example 10 | 4N—Al | 99.3 | 94.8 |

TABLE 1

| | | Brazing material | | Active element | | Heating treatment step | | Active metal compound region | Al concentration of bonding portion [at %] | Bonding rate [%] | |
|---|---|---|---|---|---|---|---|---|---|---|---|
| | Ceramic substrate | Composition | Thickness [μm] | Shape | Thickness [μm] | Temperature [° C.] | Time [min] | | | Initial stage | After hot-cold cycle |
| Example 1 | AlN | Cu—7 mass % P—15 mass % Sn—10 mass % Ni | 50 | Ti foil | 2 | 750 | 10 | Presence | 0.5 | 99.2 | 96.7 |
| Example 2 | AlN | Cu—7 mass % P—15 mass % Sn—10 mass % Ni | 50 | Ti foil | 2 | 800 | 60 | Presence | 8.0 | 99.1 | 95.9 |
| Example 3 | AlN | Cu—7 mass % P—15 mass % Sn—10 mass % Ni | 50 | Ti foil | 2 | 850 | 60 | Presence | 15.0 | 98.2 | 95.4 |
| Example 4 | AlN | Brazing material paste-Ti paste | | | | 850 | 20 | Presence | 9.8 | 98.6 | 93.3 |
| Example 5 | AlN | Cu—7 mass % P—6 mass % Sn | 30 | Zr foil | 10 | 830 | 60 | Presence | 13.2 | 98.9 | 95.1 |
| Example 6 | AlN | Cu—7 mass % P | 80 | Nb foil | 15 | 850 | 30 | Presence | 8.4 | 99.2 | 93.4 |
| Example 7 | AlN | Cu—7 mass % P | 80 | Hf foil | 15 | 850 | 30 | Presence | 9.5 | 98.1 | 93.8 |
| Example 8 | $Al_2O_3$ | Cu—7 mass % P—15 mass % Sn—10 mass % Ni | 50 | Ti foil | 2 | 830 | 40 | Presence | 9.6 | 98.5 | 93.8 |
| Comparative Example 1 | AlN | Cu—7 mass % P—15 mass % Sn—10 mass % Ni | 50 | Ti foil | 10 | 700 | 5 | Presence | 0.3 | 87.2 | 53.9 |
| Comparative Example 2 | AlN | Cu—7 mass % P—15 mass % Sn—10 mass % Ni | 50 | Ti foil | 10 | 850 | 90 | Presence | 21.0 | 98.8 | 82.6 |
| Comparative Example 3 | AlN | Cu—7 mass % P—15 mass % Sn—10 mass % Ni | 50 | — | — | 850 | 60 | Absence | — | Not bonded | — |

Example 2

Examples 9 and 10 of the Invention

Using the bonded body obtained in Example 1, a power module substrate in which aluminum (4N—Al) having purity equal to or greater than 99.99 mass % is bonded to the other surface of the ceramic substrate with an Al—Si-based brazing material interposed therebetween to form a metal layer was manufactured. The bonded body of Example 2 was used in Example 9 and the bonded body of Example 8 was used in Example 10. In Examples 9 to 10, an Al-7 mass % Si brazing material was used as the Al—Si based brazing material.

Examples 11 to 12

A Cu-7 mass % P-15 mass % Sn-10 mass % Ni brazing material, a Ti foil, a Cu plate formed of oxygen-free copper TABLE 2-continued

| | | Bonding rate of circuit layer [%] | |
|---|---|---|---|
| | Metal layer | Initial stage | After hot-cold cycle |
| Example 11 | OFC | 98.7 | 93.8 |
| Example 12 | OFC | 99.3 | 94.2 |

From the results shown in Table 1, in Examples 1 to 8, it was confirmed that since the Al concentration is in a range of 0.5 at % to 15 at %, the initial bonding rate of the ceramic substrate and the Cu plate is high and the ceramic substrate and the Cu plate are strongly bonded to each other. In addition, a bonded body having a high bonding rate even after hot-cold cycles and including a Cu plate and a ceramic substrate having excellent bond reliability was obtained.

Meanwhile, in Comparative Example 1 and Comparative Example 2, since the Al concentration was not in a range of 0.5 at % to 15 at %, an initial bonding rate of the ceramic substrate and the Cu plate and a bonding rate after hot-cold cycles were deteriorated compared to those in Examples. In addition, in Comparative Example 3 where an active metal material was not used at the time of bonding, the Cu plate and the ceramic substrate were not bonded to each other.

From the results shown in Table 2, in Examples 9 to 12, it was confirmed that the bonding rate after the hot-cold cycle test was high and the bond reliability was high.

INDUSTRIAL APPLICABILITY

According to the bonded body, the method for producing the same, and the power module substrate according to the invention, it is possible to increase bond reliability between a ceramic member and a Cu member. Therefore, according to the method for producing the bonded body according to the invention, it is possible to produce a bonded body and a power module substrate suitable for a power module used in a severe environment such as a power semiconductor element controlling the high power used for controlling wind power generation or electric vehicles such as electric cars.

REFERENCE SIGNS LIST 1 power module
3 power semiconductor (electronic component)
10 bonded body
11 ceramic substrate (ceramic member)
12 Cu member
13 bonding portion
31 brazing material
32 active metal material
40 power module substrate
41 metal layer

The invention claimed is:

1. A bonded body in which a ceramic member formed of a ceramic containing Al and a Cu member formed of Cu or a Cu alloy are bonded to each other, wherein a bonding portion is formed between the ceramic member and the Cu member, an active metal compound region formed of a compound containing active metal is formed on the bonded portion on the ceramic member side, and an Al concentration of the bonding portion having a thickness range of 0.5 .mu.m to 3 .mu.m from one surface of the active metal compound region on the Cu member side towards the Cu member side is in a range of 0.5 at % to 15 at %, wherein the one surface of the active metal compound region is a surface having ruggedness and the thickness range is a range from a point of the ruggedness nearest to the Cu member.

2. The bonded body according to claim 1,
wherein the ceramic member is configured of any of AlN and $Al_2O_3$.

3. The bonded body according to claim 2,
wherein the active metal compound region contains any of nitrides of an active metal and oxides of an active metal.

4. A power module substrate including the bonded body according to claim 2,
wherein a metal layer is formed on a surface of the ceramic member opposite to a surface to which a circuit layer is bonded, by using the Cu member as the circuit layer.

5. The bonded body according to claim 1,
wherein the active metal compound region contains any of nitrides of an active metal and oxides of an active metal.

6. A power module substrate including the bonded body according to claim 5,
wherein a metal layer is formed on a surface of the ceramic member opposite to a surface to which a circuit layer is bonded, by using the Cu member as the circuit layer.

7. A power module substrate including the bonded body according to claim 1,
wherein a metal layer is formed on a surface of the ceramic member opposite to a surface to which a circuit layer is bonded, by using the cu member as the circuit layer.

8. The power module substrate according to claim 7,
wherein the metal layer is formed of Cu or a Cu alloy.

9. A power module comprising:
the power module substrate according to claim 8;
and an electric component bonded to a surface of the circuit layer on a side opposite to the ceramic member.

10. The power module substrate according to claim 7,
wherein the metal layer is formed of Al or an Al alloy.

11. A power module comprising:
the power module substrate according to claim 10;
and an electric component bonded to a surface of the circuit layer on a side opposite to the ceramic member.

12. A power module comprising:
the power module substrate according to claim 7;
and an electric component bonded to a surface of the circuit layer on a side opposite to the ceramic member.

13. The bonded body according to claim 1,
wherein the ceramic member is configured of any of AlN and $Al_2O_3$.

14. The bonded body according to claim 1,
wherein the active metal compound region contains any of nitrides of an active metal and oxides of an active metal.

15. A power module substrate including the bonded body according to claim 1,
wherein a metal layer is formed on a surface of the ceramic member opposite to a surface to which a circuit layer is bonded, by using the Cu member as the circuit layer.

16. A method for producing a bonded body in which a ceramic member formed of a ceramic containing Al and a Cu member formed of Cu or a Cu alloy are bonded to each other, the method comprising: a laminating step of forming a laminate obtained by laminating the Cu member on the ceramic member through a Cu—P-based brazing material and an active metal material containing an active metal; and a heating treatment step of melting the Cu—P-based brazing material by performing heating treatment with respect to the laminate and diffusing Al contained in the ceramic member towards the Cu—P-based brazing material, wherein the Cu—P-based brazing material is any one kind selected from a Cu—P brazing material, a Cu—P—Sn brazing material, a Cu—P—Sn—Ni brazing material, and a Cu—P—Zn brazing material.

17. The method for producing a bonded body according to claim 16,
wherein the Cu—P-based brazing material contains 3 mass % to 10 mass % of P.

18. The method for producing a bonded body according to claim 17,
wherein the Cu—P-based brazing material is any one kind selected from a Cu—P brazing material, a Cu—P—Sn brazing material, a Cu—P—Sn—Ni brazing material, and a Cu—P—Zn brazing material.

* * * * *